(12) United States Patent
Sadovnikov et al.

(10) Patent No.: US 10,079,294 B2
(45) Date of Patent: Sep. 18, 2018

(54) INTEGRATED JFET STRUCTURE WITH IMPLANTED BACKGATE

(71) Applicant: Texas Instruments Incorporated, Dallas, TX (US)

(72) Inventors: Alexei Sadovnikov, Sunnyvale, CA (US); Doug Weiser, Plano, TX (US); Mattias Erik Dahlstrom, Los Altos, CA (US); Joel Martin Halbert, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/195,287

(22) Filed: Jun. 28, 2016

(65) Prior Publication Data

US 2017/0373171 A1   Dec. 28, 2017

(51) Int. Cl.
*H01L 29/66* (2006.01)
*H01L 21/265* (2006.01)
*H01L 21/324* (2006.01)
*H01L 23/535* (2006.01)
*H01L 29/808* (2006.01)

(52) U.S. Cl.
CPC ...... *H01L 29/66916* (2013.01); *H01L 21/265* (2013.01); *H01L 21/324* (2013.01); *H01L 23/535* (2013.01); *H01L 29/8086* (2013.01)

(58) Field of Classification Search
CPC ............. H01L 29/0649; H01L 29/0821; H01L 29/732; H01L 29/0653; H01L 29/7835; H01L 21/8249; H01L 27/0623; H01L 29/1095; H01L 29/66242; H01L 27/0826; H01L 29/66689; H01L 29/7816; H01L 21/82285
See application file for complete search history.

(56) References Cited

U.S. PATENT DOCUMENTS

| | | | |
|---|---|---|---|
| 2008/0251818 A1* | 10/2008 | Hao | H01L 29/66901 257/256 |
| 2010/0032731 A1* | 2/2010 | Babcock | H01L 27/095 257/280 |
| 2016/0079277 A1* | 3/2016 | Hook | H01L 21/823807 257/348 |

\* cited by examiner

*Primary Examiner* — Robert Bachner
(74) *Attorney, Agent, or Firm* — Andrew R. Ralston; Charles A. Brill; Frank D. Cimino

(57) ABSTRACT

A semiconductor device contains a JFET with a channel layer having a first conductivity type in a substrate. The JFET has a back gate having a second, opposite, conductivity type below the channel. The back gate is laterally aligned with the channel layer. The semiconductor device is formed by forming a channel mask over the substrate of the semiconductor device which exposes an area for the channel dopants. The channel dopants are implanted into the substrate in the area exposed by the channel mask while the channel mask is in place. The back gate dopants are implanted into the substrate while the channel mask is in place, so that the implanted channel dopants are laterally aligned with the implanted channel dopants.

20 Claims, 17 Drawing Sheets

INTEGRATED JFET STRUCTURE WITH IMPLANTED BACKGATE

FIELD OF THE INVENTION

This invention relates to the field of semiconductor devices. More particularly, this invention relates to junction field effect transistors (JFETs) in semiconductor devices.

BACKGROUND OF THE INVENTION

Some semiconductor devices contain a junction field effect transistor (JFET) having a top gate and a back gate to provide adequate control of the JFET channel resistance. The back gate may be provided by a buried layer having an opposite conductivity type from the JFET channel; the buried layer may be formed concurrently with other buried layers providing other functions in the semiconductor device, such as collectors for vertical bipolar junction transistors or isolation layers for high voltage transistors. Frequently, the depth of the buried layers is dictated by requirements of the vertical bipolar junction transistors or the isolation structures for the high voltage transistors, and is deeper than desired for optimum JFET performance, especially for a low voltage JFET.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device contains a JFET with a channel layer having a first conductivity type in a substrate of the semiconductor device. The JFET has a top gate over the channel layer and a back gate having a second, opposite, conductivity type below the channel. The channel layer includes channel dopants of the first conductivity type having a uniform lateral distribution between a source and drain of the JFET. The back gate includes back gate dopants of the second conductivity type having a uniform lateral distribution under the channel layer. The back gate is laterally aligned with the channel layer.

The semiconductor device is formed by forming a channel mask over the substrate of the semiconductor device which exposes an area for the channel dopants. The channel dopants are implanted into the substrate in the area exposed by the channel mask while the channel mask is in place. The back gate dopants are implanted into the substrate while the channel mask is in place, so that the implanted channel dopants are laterally aligned with the implanted channel dopants.

DETAILED DESCRIPTION OF EXAMPLE EMBODIMENTS

Figure 1:
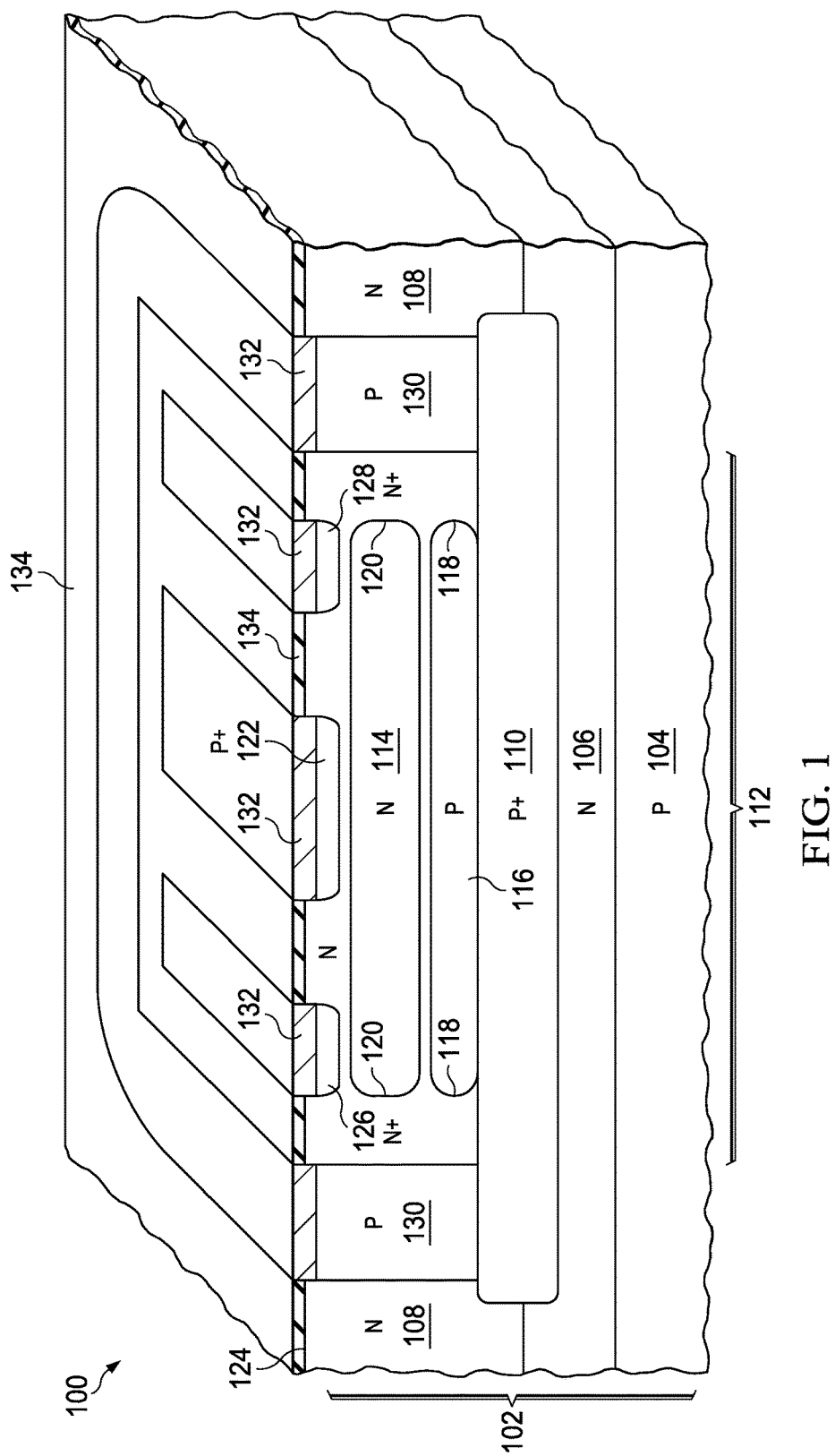
FIG. 1 is a cross section of an example semiconductor device.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device has a substrate comprising a semiconductor material containing silicon, such as crystalline silicon, silicon germanium or silicon carbide. The semiconductor device contains a JFET in the semiconductor material. The JFET has a channel layer having a first conductivity type, a top gate over the channel layer and a back gate having a second, opposite, conductivity type below the channel layer. The channel layer includes channel dopants of the first conductivity type having a uniform lateral distribution between a source and drain of the JFET. The back gate includes back gate dopants of the second conductivity type having a uniform lateral distribution under the channel layer. The back gate is laterally aligned with the channel layer.

For the purposes of this disclosure, the phrase "laterally aligned" is understood to mean a lateral boundary of the back gate has a same shape as a lateral boundary of the channel layer, and the back gate lateral boundary is disposed directly below the channel layer lateral boundary. Furthermore, the phrase "laterally aligned" is understood to include a case in which the back gate lateral boundary is recessed from the channel layer lateral boundary, or extends past the channel layer lateral boundary, by an equal distance around the channel layer lateral boundary, the distance being less than a depth of a peak dopant density of the back gate.

For the purposes of this disclosure, the term "dopants of a first conductivity type" and the term "dopants of a second conductivity type" are understood to mean dopants which provide the first conductivity type and dopants which provide the second conductivity type, respectively, in a semiconductor material. For example, for a case in which the first conductivity type is n-type and the second conductivity type is p-type, phosphorus and arsenic are dopants of the first conductivity type, as they provide n-type conductivity in the semiconductor material, and boron is a dopant of the second conductivity type, as it provides p-type conductivity in the semiconductor material.

The semiconductor device is formed by forming a channel mask for an ion implant process over the substrate of the semiconductor device. The channel mask exposes an area for the channel layer. The channel dopants are implanted into the substrate in the area exposed by the channel mask while the channel mask is in place. The back gate dopants are implanted into the substrate while the channel mask is in place, so that the implanted channel dopants are laterally aligned with the implanted channel dopants. The substrate is subsequently annealed to activate the implanted dopants to form the channel layer with the channel dopants and the back gate with the back gate dopants, as described above.

FIG. 1 is a cross section of an example semiconductor device. The semiconductor device 100 has, in the instant example, a substrate 102 which includes a p-type crystalline silicon base layer 104. The base layer 104 may be part of a silicon wafer, for example. The substrate 102 further includes a first n-type epitaxial layer 106 of a silicon-containing semiconductor material disposed on the base layer 104. The first n-type epitaxial layer 106 may be, for example, 3 microns to 8 microns thick. The substrate 102 further includes a second n-type epitaxial layer 108 of a silicon-containing semiconductor material disposed on the first n-type epitaxial layer 106. The second n-type epitaxial layer 108 may be, for example, 3 microns to 6 microns thick, and may have an average dopant density of $1 \times 10^{15}$ cm$^{-3}$ to $1 \times 10^{16}$ cm$^{-3}$. A p-type buried layer 110 is disposed at a boundary between the first n-type epitaxial layer 106 and the second n-type epitaxial layer 108, in an area for an example JFET 112. The buried layer 110 extends up unto the second n-type epitaxial layer 108, and down into the first n-type epitaxial layer 106, and may be, for example, 2 microns to 5 microns thick, with an average dopant density of $1 \times 10^{18}$ cm$^{-3}$ to $1 \times 10^{19}$ cm$^{-3}$. The semiconductor device 100 may contain additional p-type buried layers in additional components, for example as buried collectors in vertical PNP bipolar junction transistors or as parts of isolation layers for p-channel metal oxide semiconductor (PMOS) transistors. A thickness of the second n-type epitaxial layer 108 may be selected to provide a desired structure for the additional components.

The JFET 112 includes an n-type channel layer 114 above the buried layer 110 in the second n-type epitaxial layer 108. An average dopant density of the channel layer 114 may be, for example, $1 \times 10^{15}$ cm$^{-3}$ to $1 \times 10^{16}$ cm$^{-3}$. In the instant example, the channel layer 114 may be laterally surrounded by the second n-type epitaxial layer 108. The JFET 112 further includes a p-type back gate 116 below the channel layer 114. The back gate 116 is disposed above, and in contact with, the buried layer 110. A lateral boundary 118 of the back gate 116 is laterally aligned with a lateral boundary 120 of the channel layer 114. A thin layer of the second n-type epitaxial layer 108 may be disposed between the channel layer 114 and the back gate 116, as depicted in FIG. 1. Alternatively, a top surface of the back gate 116 may contact a bottom surface of the channel layer 114. A thickness and dopant density of the channel layer 114 may be selected to provide desired values of channel resistance and transconductance for the JFET 112; the selected thickness of the channel layer 114 may be significantly less than a depth of the top surface of the buried layer 110. Having the back gate 116 separate from the buried layer 110 may advantageously provide effective back gate control for the JFET, to attain the desired values of channel resistance and transconductance. A dopant density of the back gate 116 may be selected to provide a desired balance between depletion of the back gate 116 and capacitance of a pn junction between the back gate 116 and the channel layer 114. A low sheet resistance of the buried layer 110 advantageously provides uniform voltage for the back gate 116.

A p-type top gate 122 is disposed in the substrate 102 above a central portion of the channel layer 114. In the instant example, the top gate 122 is a heavily doped p-type region extending to a top surface 124 of the substrate 102. The top gate 122 may be formed concurrently with source and drain regions of PMOS transistors or emitters of vertical PNP bipolar junction transistors in the semiconductor device 100. An n-type source 126 is disposed in the substrate above one end of the channel layer 114, adjacent to the top gate 122. An n-type drain 128 is disposed above an opposite end of the channel layer 114, adjacent to the top gate and opposite from the source 126. In the instant example, the source 126 and drain 128 are heavily doped n-type regions extending to the top surface 124 of the substrate 102, and may be formed concurrently with source and drain regions of n-channel metal oxide semiconductor (NMOS) transistors in the semiconductor device 100.

A back gate contact 130 is disposed in the substrate 102, contacting the buried layer 110 and extending to the top surface 124 of the substrate 102. Electrical coupling from the top surface of the substrate 102 to the back gate 116 is provided through the back gate contact 130 and the buried layer 110. The back gate contact 130 may include a sinker containing heavily doped p-type semiconductor material, as depicted in FIG. 1. In the instant example, the channel layer 114 does not extend to the heavily doped p-type semiconductor material of the back gate contact 130, in order to increase a breakdown voltage of the JFET 112. N-type semiconductor material of the second n-type epitaxial layer 108 may be disposed between the lateral boundary of the channel layer 114 and the back gate contact 130. In the instant example, n-type semiconductor material of the second n-type epitaxial layer 108 may also be disposed between the lateral boundary 118 of the back gate 116 and the back gate contact 130, as depicted in FIG. 1. Other structures for the back gate contact 130, such as a deep trench contact structure, are within the scope of the instant example.

The JFET 112 has a linear configuration, in which the top gate 122, source 126 and drain 128 are configured in parallel stripes, as depicted in FIG. 1. Other configurations of the JFET 112, for example closed-loop configurations, are within the scope of the instant example. Metal silicide 132 may be formed at the top surface 124 of the substrate 102 in the top gate 122, source 126 and drain 128, and the back gate contact 130. In the instant example, the metal silicide 132 on the top gate 122, source 126 and drain 128, and the back gate contact 130, are separated by a silicide block layer 134 of dielectric material. Other structures for separating the metal silicide 132, such as field oxide, are within the scope of the instant example.

Figure 2A:
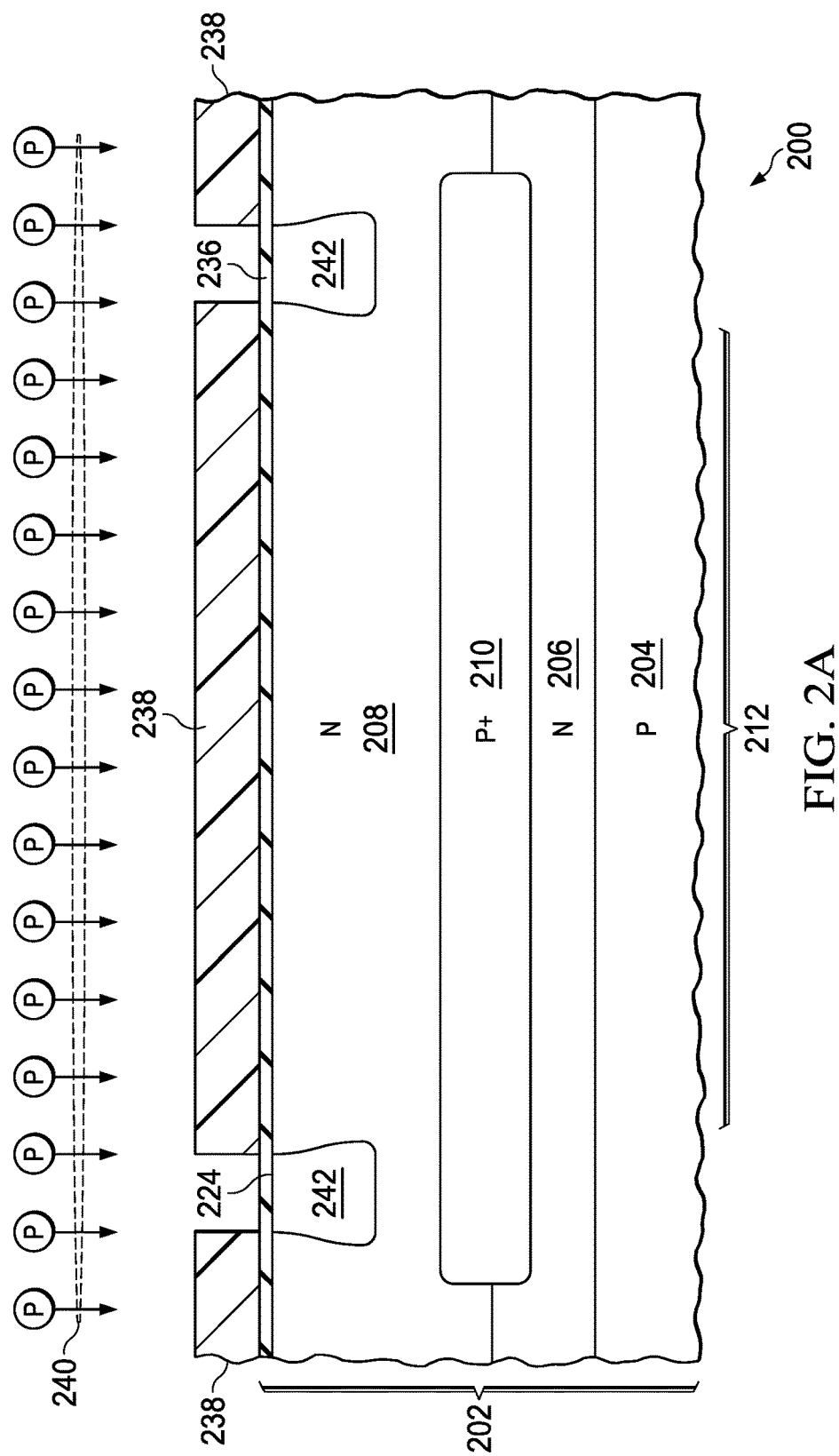
FIG. 2A through FIG. 2E are cross sections of a semiconductor device containing a JFET, depicted in stages of an example method of formation.

FIG. 2A through FIG. 2E are cross sections of a semiconductor device containing a JFET, depicted in stages of an example method of formation. Referring to FIG. 2A, the semiconductor device 200 is formed in a substrate 202 which may be, for example, a semiconductor wafer. In the instant example, the substrate 202 includes a p-type crystalline silicon base layer 204. A first n-type epitaxial layer 206 of a silicon-containing semiconductor material is formed on the base layer 204 by a first epitaxial process. The first n-type epitaxial layer 206 may be doped with phosphorus during the first epitaxial process. P-type dopants such as boron are implanted into the first n-type epitaxial layer 206 in an area for a heavily doped p-type buried layer 210 in an area for the JFET 212. A thermal drive operation, for example 20 minutes to 40 minutes at 900° C., may activate and diffuse the implanted p-type dopants in the first n-type epitaxial layer 206. A second n-type epitaxial layer 208 of a silicon-containing semiconductor material, is formed on the first n-type epitaxial layer 206 by a second epitaxial process. The second n-type epitaxial layer 208 may be, for example, 3 microns to 6 microns thick. The second n-type epitaxial layer 208 may also be doped with phosphorus during the second epitaxial process to have an average dopant density of $1\times10^{15}$ cm$^{-3}$ to $1\times10^{16}$ cm$^{-3}$. The second epitaxial process causes the implanted p-type dopants to further diffuse downward into the first n-type epitaxial layer 206 and upward into the second n-type epitaxial layer 208. Another thermal drive process may be applied to further diffuse the implanted p-type dopants to form the buried layer 210 with a desired thickness. Additional p-type buried layers may be formed in the semiconductor device 200 concurrently with the buried layer 210.

A layer of pad oxide 236 may be formed over the second n-type epitaxial layer 208 at a top surface 224 of the substrate 202, to protect the top surface 224 during subsequent process steps. The pad oxide 236 may be, for example, 10 nanometers to 50 nanometers thick, and may be formed by a thermal oxidation process. A sinker mask 238 is formed over the top surface 224 of the substrate 202, and over the layer of pad oxide 236. The sinker mask 238 may include photoresist formed by a photolithographic process, or may include hard mask material such as silicon dioxide and/or silicon nitride. The sinker mask 238 exposes areas adjacent to the area for the JFET 212 for p-type sinkers which make electrical connections to the buried layer 210. The sinker mask 238 may expose areas for other sinkers in the semiconductor device 200. P-type dopants 240 such as boron are implanted in one or more doses, at one or more respective implant energies, into the substrate 202 in the areas exposed by the sinker mask 238 to form sinker implanted regions 242.

The sinker mask 238 is subsequently removed. Organic material in the sinker mask 238 may be removed by an ash process using oxygen radicals, followed by a wet clean process. Silicon dioxide in the sinker mask 238 may be removed by a dilute aqueous solution of hydrofluoric acid. Silicon nitride in the sinker mask 238 may be removed by a plasma etch using fluorine radicals or an aqueous solution of phosphoric acid.

Figure 2B:
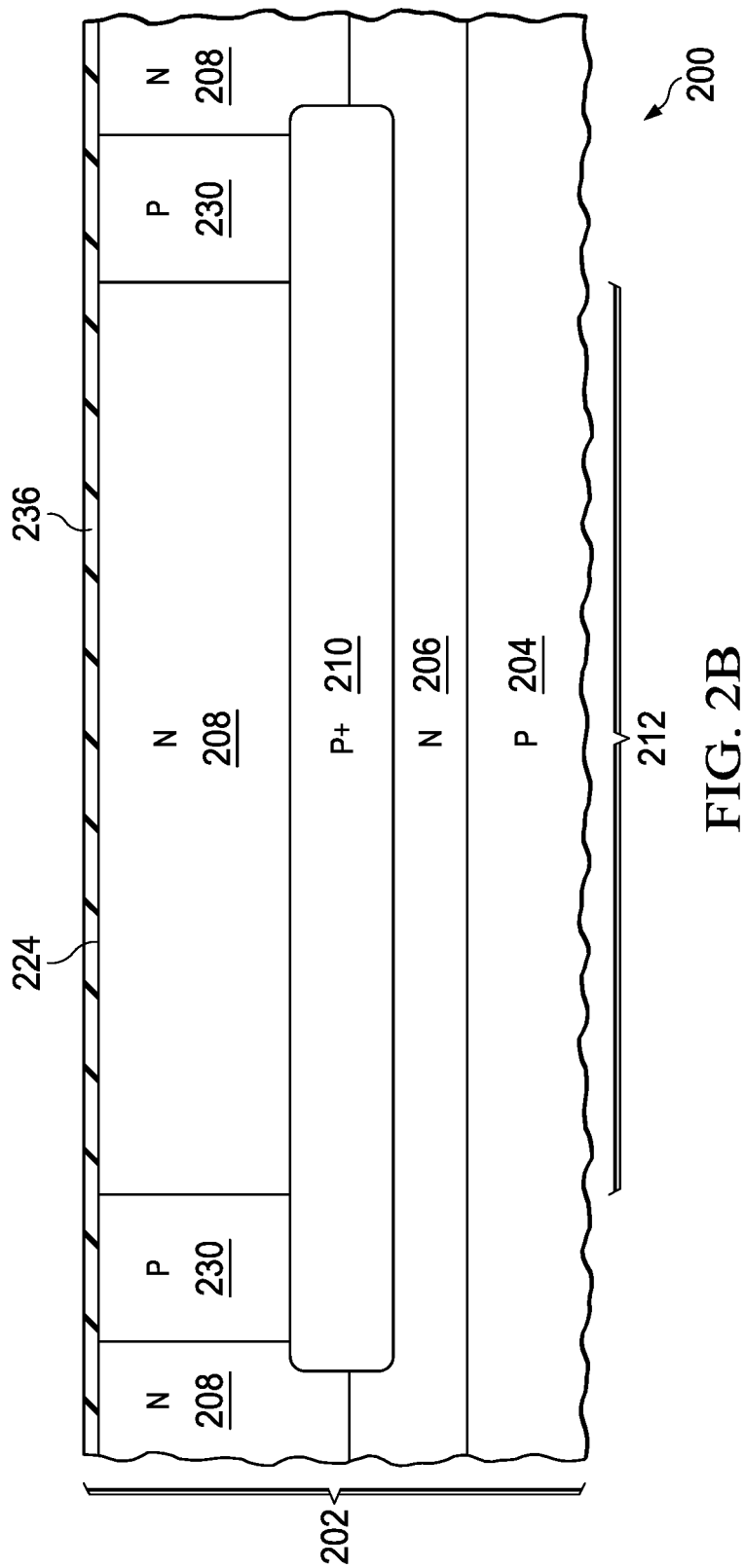

Referring to FIG. 2B, a thermal drive process activates and diffuses the implanted p-type dopants in the sinker implanted regions 242 of FIG. 2A to form a p-type back gate contact 230 for the JFET 212. The back gate contact 230 makes electrical connection to the buried layer 210 and extend to the top surface 224 of the substrate 202. The thermal drive process may include, for example, 200 minutes to 300 minutes at 1000° C. to 1150° C. Additional oxide may be formed at the top surface 224 during the thermal drive.

Figure 2C:
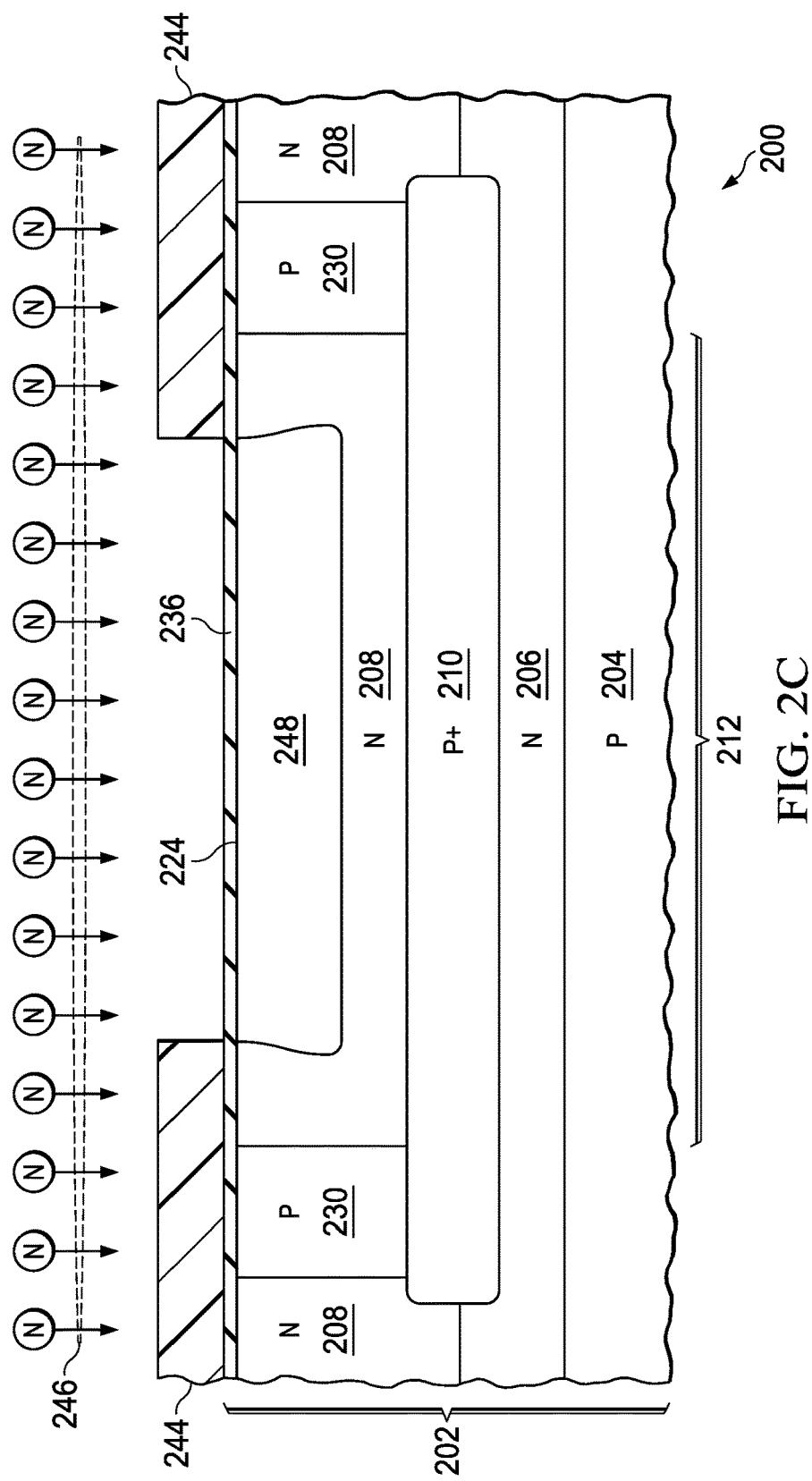

Referring to FIG. 2C, a channel mask 244 is formed over the top surface 224 of the substrate 202. The channel mask 244 exposes an area for a channel layer of the JFET 212. The area exposed by the channel mask 244 is recessed from the back gate contact 230, so that the subsequently formed channel layer is separated from the back gate contact 230, for example as discussed in reference to FIG. 1. The channel mask 244 may include photoresist, or may include hard mask materials. N-type dopants 246 such as phosphorus are implanted into the substrate 202 in the area exposed by the channel mask 244 to form a channel implanted region 248. The n-type dopants 246 may be implanted, for example with a dose of $1\times10^{12}$ cm$^{-2}$ to $4\times10^{12}$ cm$^{2}$, at an energy of 400 kiloelectron volts (keV) to 650 keV. The n-type dopants 246 may optionally be implanted in two or more doses at two or more respective energies, to obtain a more uniform vertical distribution of the implanted n-type dopants 246 in the channel implanted region 248.

Figure 2D:
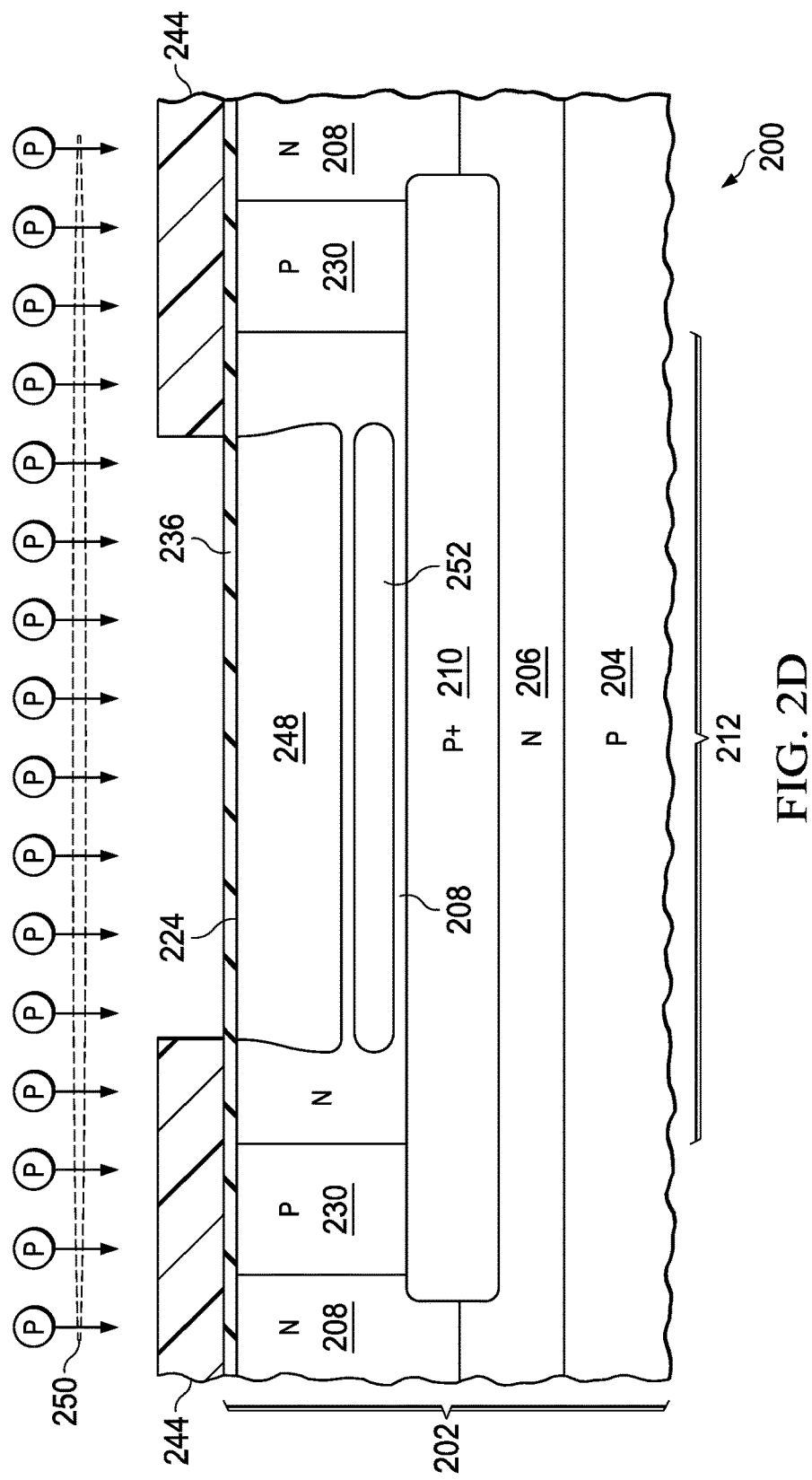

Referring to FIG. 2D, p-type dopants 250 such as boron are implanted into the substrate 202 in the area exposed by the channel mask 244 to form a back gate implanted region 252 below the channel implanted region 248 and above the buried layer 210. The p-type dopants 250 may be implanted, for example, with a dose of $1\times10^{13}$ cm$^{-2}$ to $1\times10^{15}$ cm$^{-2}$, at an energy of 800 keV to 1200 keV. The p-type dopants 250 may be implanted in two or more doses at two or more respective energies, to provide a more uniform vertical distribution of the implanted p-type dopants 250 from a bottom of the channel implanted region 248 to a top of the buried layer 210.

In an alternate version of the instant example, the back gate implanted region 252 may be formed before the channel implanted region 248. Forming the back gate implanted region 252 and the channel implanted region 248 with the channel mask 244 may advantageously reduce a fabrication cost of the semiconductor device 200 compared to a process using separate masks. The channel mask 244 is subsequently removed, for example as described in reference to the sinker mask 238 of FIG. 2A.

Figure 2E:
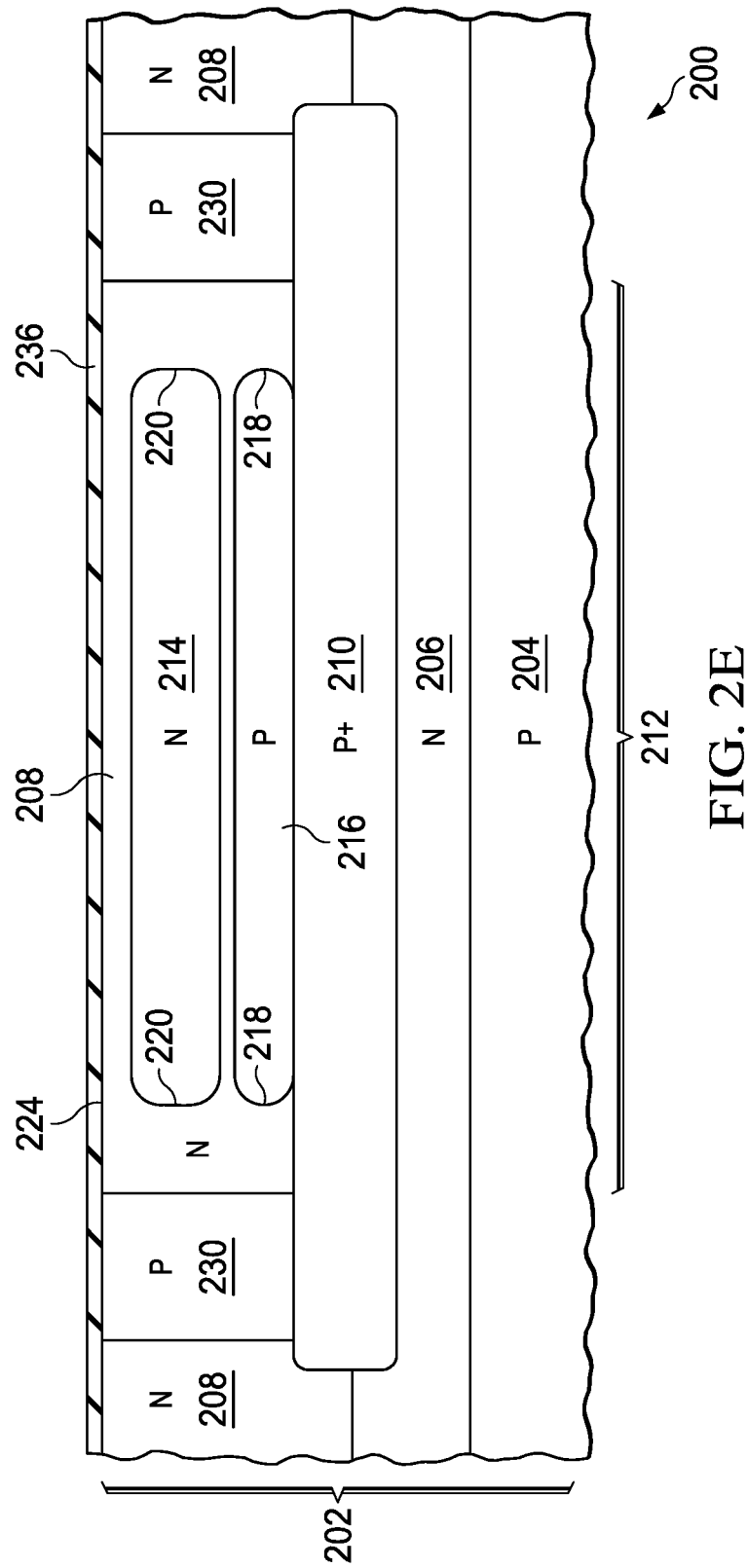

Referring to FIG. 2E, a thermal anneal operation is performed on the substrate 202 which activates and diffuses the implanted n-type dopants in the channel implanted region 248 of FIG. 2D to form an n-type channel layer 214, and activates and diffuses the implanted p-type dopants in the back gate implanted region 252 of FIG. 2D to form a p-type back gate 216. A lateral boundary 218 of the back gate 216 is laterally aligned with a lateral boundary 220 of the channel layer 214. In the instant example, the channel layer 214 may be laterally surrounded by the second n-type epitaxial layer 208. N-type semiconductor material of the second n-type epitaxial layer 208 may also be disposed between the lateral boundary 218 of the back gate 216 and the back gate contact 230. Formation of the semiconductor device 200 continues with formation of a top gate, source and drain, for example, as described in reference to FIG. 1.

Figure 3A:
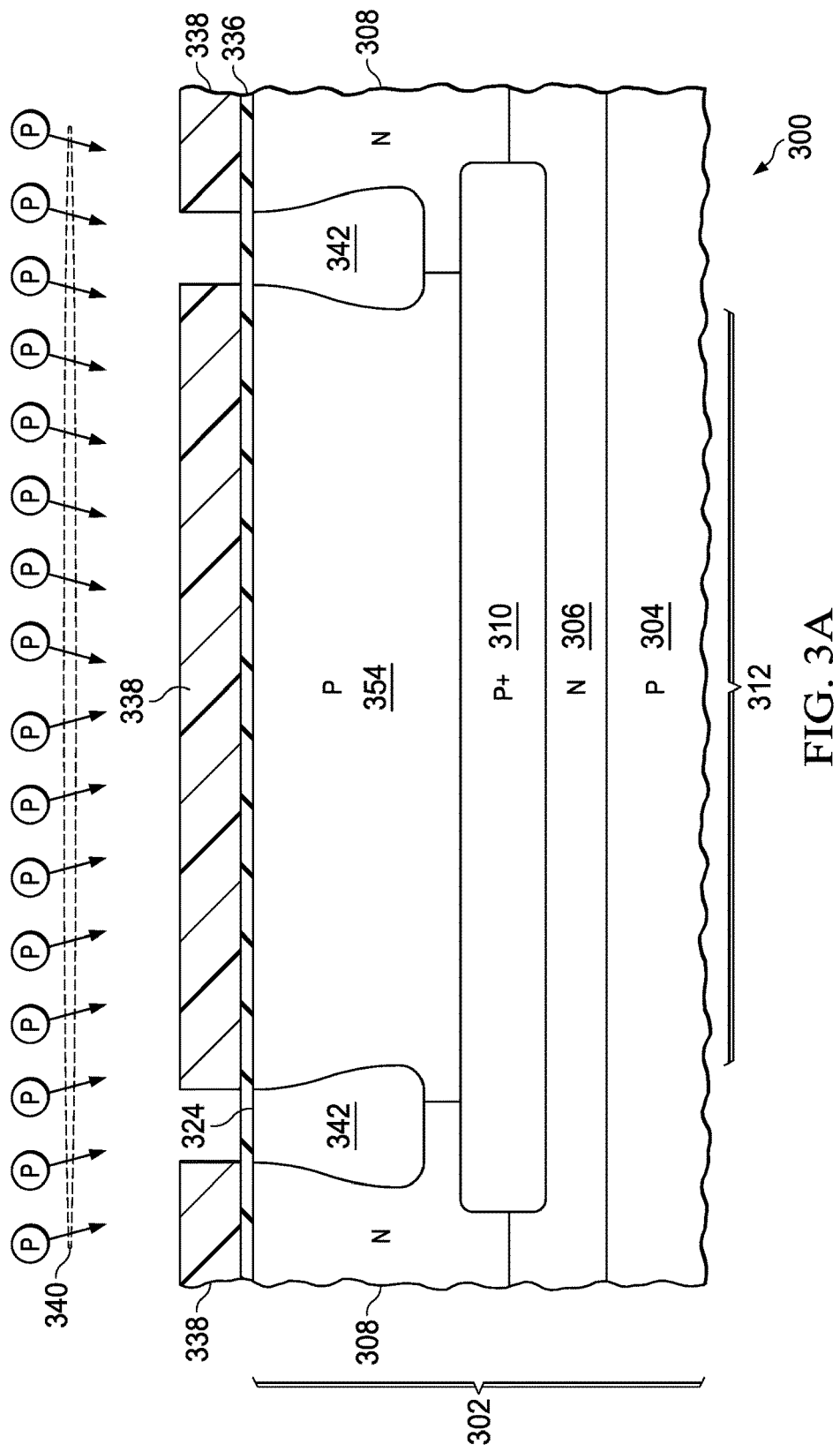
FIG. 3A through FIG. 3G are cross sections of another semiconductor device containing a JFET, depicted in stages of an example method of formation.

FIG. 3A through FIG. 3G are cross sections of another semiconductor device containing a JFET, depicted in stages of an example method of formation. Referring to FIG. 3A, the semiconductor device 300 is formed in a substrate 302, for example as described in reference to FIG. 2A. In the instant example, the substrate 302 includes a p-type crystalline silicon base layer 304. A first n-type epitaxial layer 306 of a silicon-containing semiconductor material is formed on the base layer 304 by a first epitaxial process. A second n-type epitaxial layer 308 of a silicon-containing semiconductor material is formed on the first n-type epitaxial layer 306 by a second epitaxial process. A heavily doped p-type buried layer 310 is formed in an area for the JFET 312, overlapping a boundary between the first n-type epitaxial layer 306 and the second n-type epitaxial layer 308. The buried layer 310 may be formed as described in reference to FIG. 2A. A p-type well 354 may be formed in the second n-type epitaxial layer 308 in the area for the JFET 312, extending from a top surface 324 of the substrate 302 to the buried layer 310. An average dopant density in the p-type well 354 may be, for example, $3\times10^{15}$ cm$^{-3}$ to $1\times10^{17}$ cm$^{-3}$.

A layer of pad oxide 336 may be formed over the second n-type epitaxial layer 308 at the top surface 324 of the substrate 302. A sinker mask 338 is formed over the top surface 324 of the substrate 302, and over the layer of pad oxide 336. The sinker mask 338 exposes areas adjacent to the area for the JFET 312 for p-type sinkers. P-type dopants 340 such as boron are implanted in four steps, at tilt angles greater than 15 degrees, and rotation angles 90 degrees apart. The purpose of the high tilt angles is to form sinkers with greater widths at the buried layer 310 that at a subsequently-formed channel layer of the JFET 312. The implanted p-type dopants 340 form sinker implanted regions 342. The sinker mask 338 is subsequently removed.

Figure 3B:
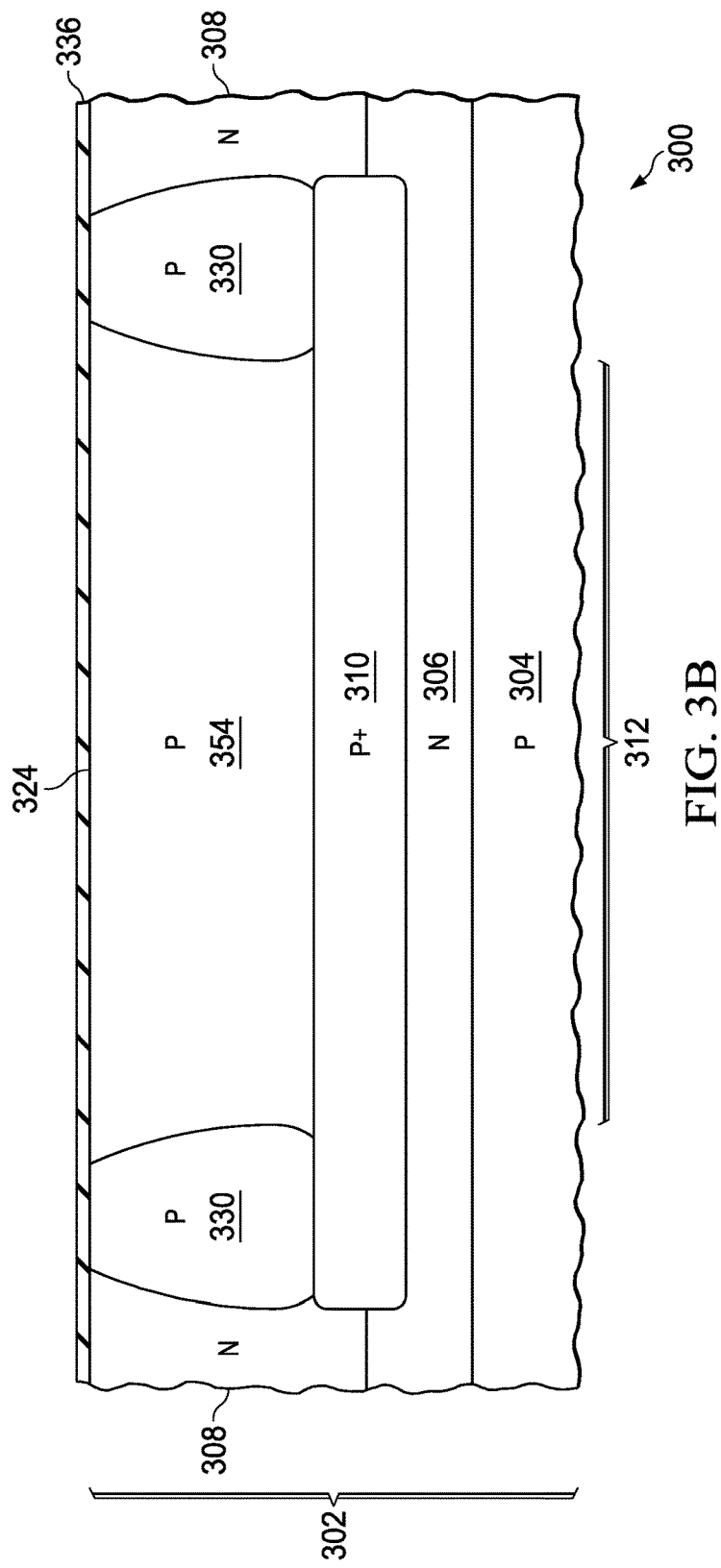

Referring to FIG. 3B, a thermal drive process activates and diffuses the implanted p-type dopants in the sinker implanted regions 342 of FIG. 3A to form a p-type back gate contact 330 for the JFET 312. The back gate contact 330 makes electrical connection to the buried layer 310 and extends to the top surface 324 of the substrate 302. The back gate contact 330 is wider at boundary with the buried layer 310 that at the top surface 324 of the substrate 302.

Figure 3C:
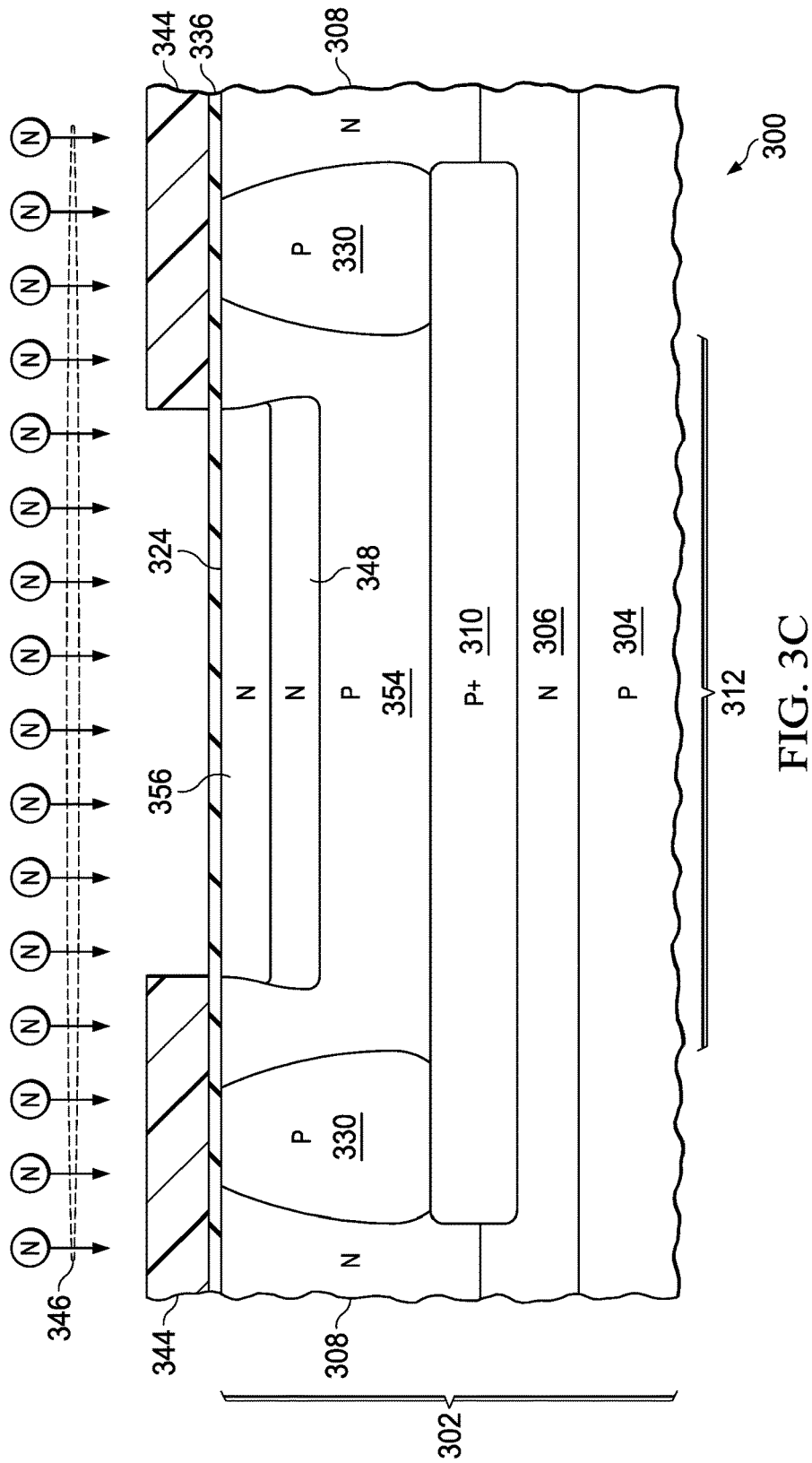

Referring to FIG. 3C, a channel mask 344 is formed over the top surface 324 of the substrate 302. The channel mask 344 exposes an area of the JFET 312 for a channel layer which is recessed from the back gate contact 330, so that the subsequently formed channel layer is separated from the back gate contact 330. In the instant example, n-type dopants 346 such as phosphorus are implanted in two doses with two different energies into the substrate 302 in the area exposed by the channel mask 344 to form a first channel implanted region 348 and to form a second channel implanted region 356 above the first channel implanted region 348. In the instant example, the n-type dopants 346 may be implanted with tilt angles less than 4 degrees, to reduce a lateral spread of the first channel implanted region 348 and the second channel implanted region 356. The energies of the two doses of the n-type dopants 346 may be selected to obtain a more uniform vertical distribution of the implanted n-type dopants 346 in the combined first channel implanted region 348 and second channel implanted region 356, and hence in the subsequently-formed channel layer.

Figure 3D:
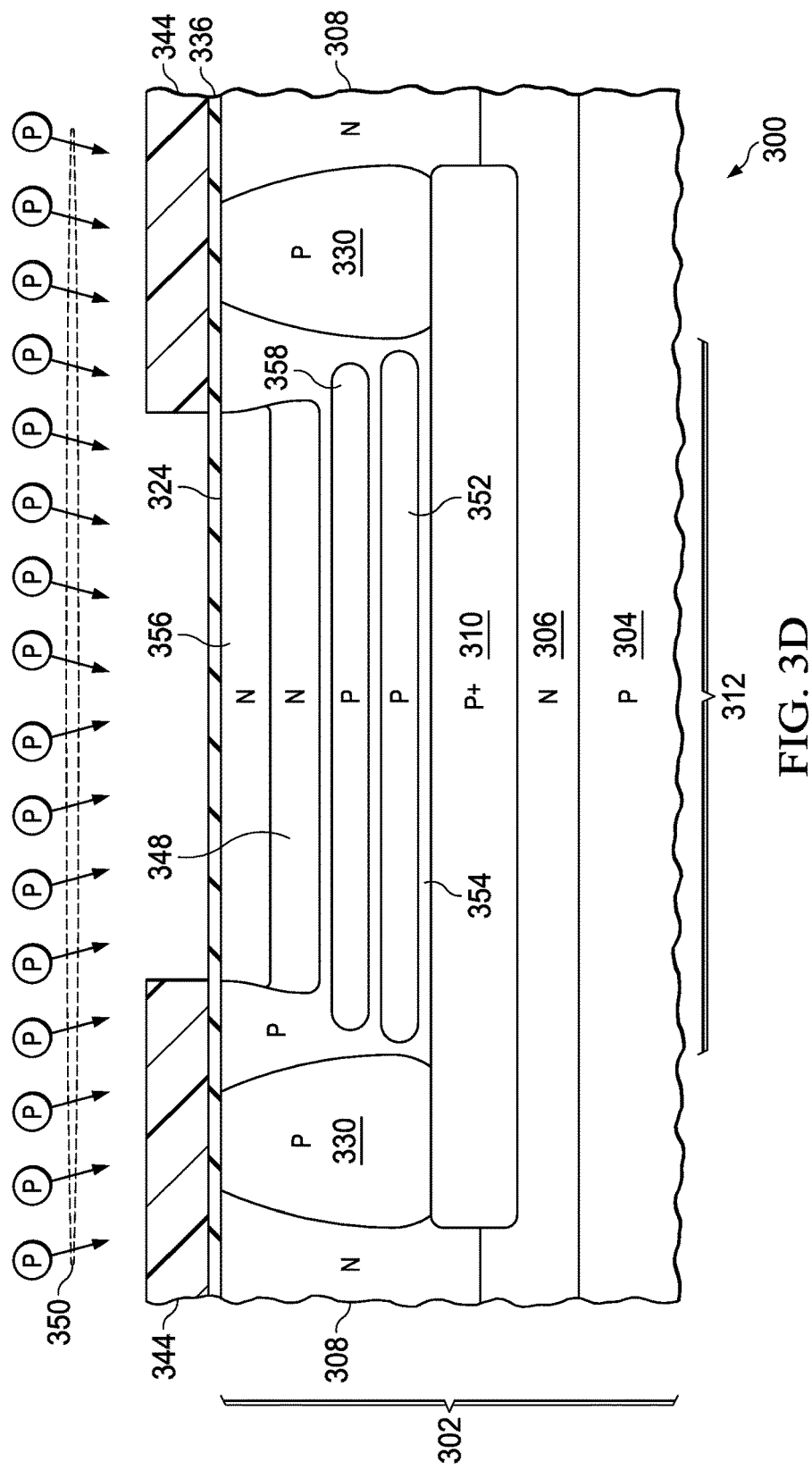

Referring to FIG. 3D, in the instant example, p-type dopants 350 such as boron are implanted in two doses with two different energies into the substrate 302 in the area exposed by the channel mask 344 to form a first back gate implanted region 352 above the buried layer 310, and to form a second back gate implanted region 358 below the first channel implanted region 348 and above the first back gate implanted region 352. In the instant example, each dose of the p-type dopants 350 may be implanted in four steps, at tilt angles greater than 15 degrees, and rotation angles 90 degrees apart. The purpose of the high tilt angles is to form a back gate of the JFET 312 that is wider than a subsequently-formed channel layer above the back gate, with the back gate possibly extending to the back gate contact 330. The energies of the two doses of the p-type dopants 350 may be selected to obtain a more uniform vertical distribution of the implanted p-type dopants 350 in the combined first back gate implanted region 352 and second back gate implanted region 358, and hence in the subsequently-formed back gate.

Figure 3E:
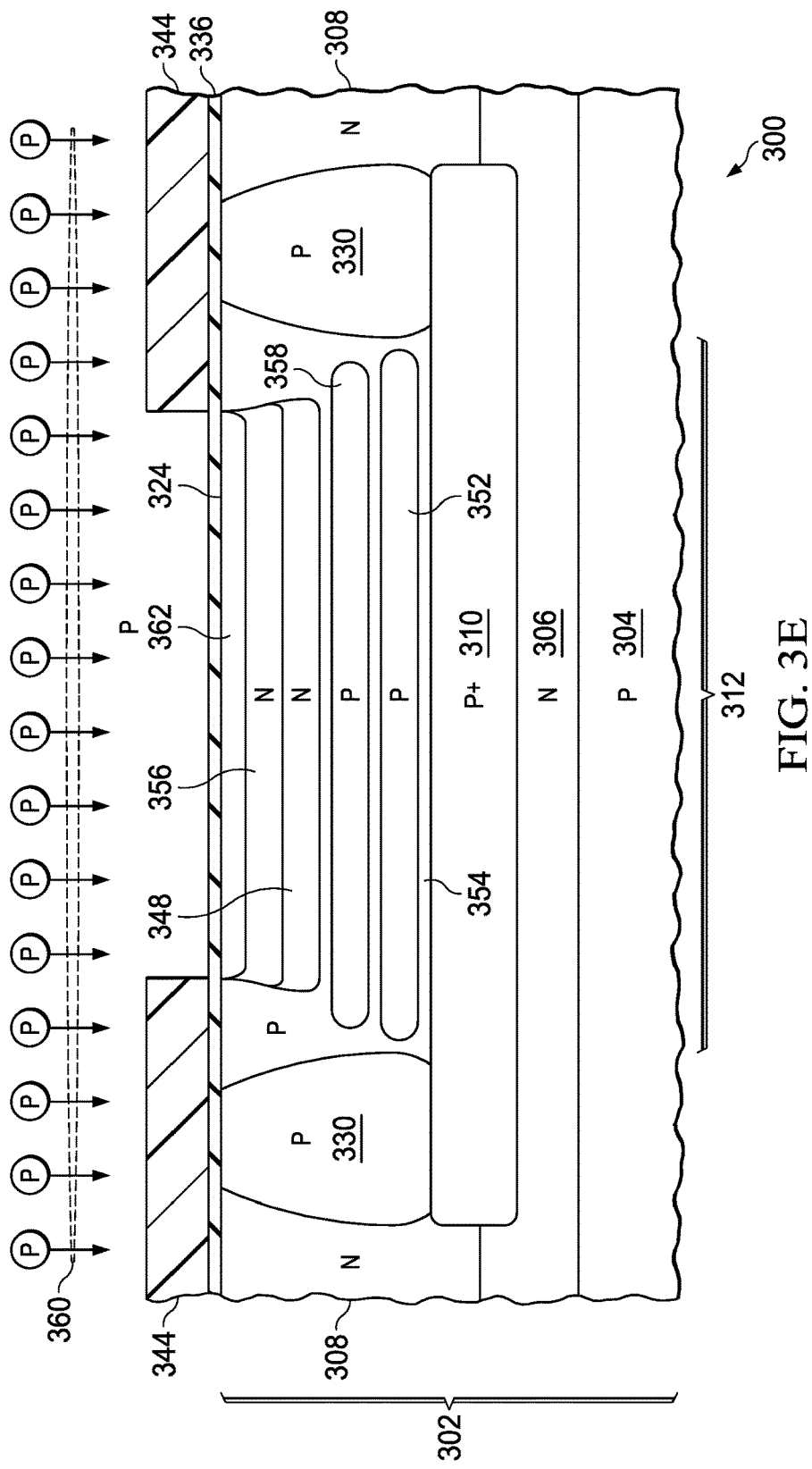

Referring to FIG. 3E, p-type dopants 360 such as boron are implanted into the substrate 302 in the area exposed by the channel mask 344 to form a skin implanted region 362 above the first channel implanted region 348 and the second channel implanted region 356. A dose of the p-type dopants 360 may be sufficient to provide a p-type layer above the subsequently-formed channel layer. For example, the dose of the p-type dopants 360 may be $1 \times 10^{12}$ cm$^{-2}$ to $1 \times 10^{13}$ cm$^{-2}$. The first channel implanted region 348 and the second channel implanted region 356, the first back gate implanted region 352 and the second back gate implanted region 358, and the skin implanted region 362 may be formed in any order. Forming the first channel implanted region 348 and the second channel implanted region 356, the first back gate implanted region 352 and the second back gate implanted region 358, and the skin implanted region 362 using the channel mask 344 may advantageously reduce a fabrication cost of the semiconductor device 300. The channel mask 344 is subsequently removed.

Figure 3F:
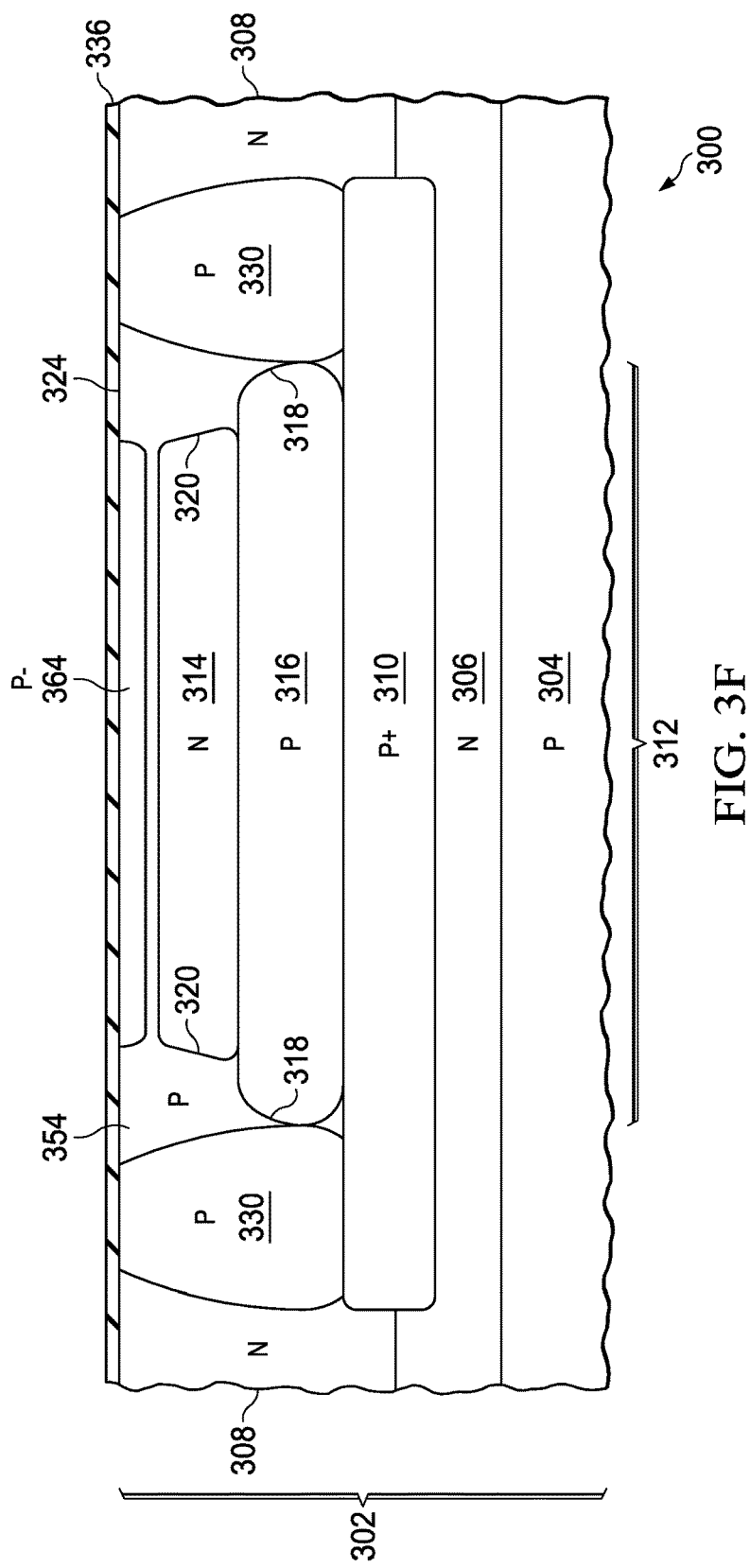

Referring to FIG. 3F, a thermal anneal operation is performed on the substrate 302 which activates and diffuses the implanted n-type dopants in the first channel implanted region 348 and the second channel implanted region 356 of FIG. 3E to form an n-type channel layer 314. The thermal operation also activates and diffuses the implanted p-type dopants in the first back gate implanted region 352 and the second back gate implanted region 358 of FIG. 3E to form a p-type back gate 316. The thermal operation further activates and diffuses the implanted p-type dopants in the skin implanted region 362 of FIG. 3E to form a p-type skin inversion layer 364. A bottom of the back gate 316 contacts the buried layer 310, and a top of the back gate 316 extends up proximate to, and possibly contacts, the channel layer 314.

A lateral boundary 318 of the back gate 316 is laterally aligned with a lateral boundary 320 of the channel layer 314. In the instant example, the lateral boundary 318 of the back gate 316 extends past the lateral boundary 320 of the channel layer 314 by an equal distance around the lateral boundary 320 of the channel layer 314, as a result of the p-type dopants of the back gate 316 being implanted at high tilt angles, as described in reference to FIG. 3D. The distance that the lateral boundary 318 of the back gate 316 extends past the lateral boundary 320 of the channel layer 314 is less than a depth of a peak dopant density of the back gate 316. In the instant example, the channel layer 314 may be laterally surrounded by p-type semiconductor material of the p-type well 354, which may advantageously improve a breakdown voltage of the JFET 312. The back gate 316 may extend to the back gate contact 330, as depicted in FIG. 3F, as a result of the p-type dopants of the back gate 316 and the p-type dopants of the back gate contact 330 being implanted at high tilt angles, as described in reference to FIG. 3A and FIG. 3D.

Figure 3G:
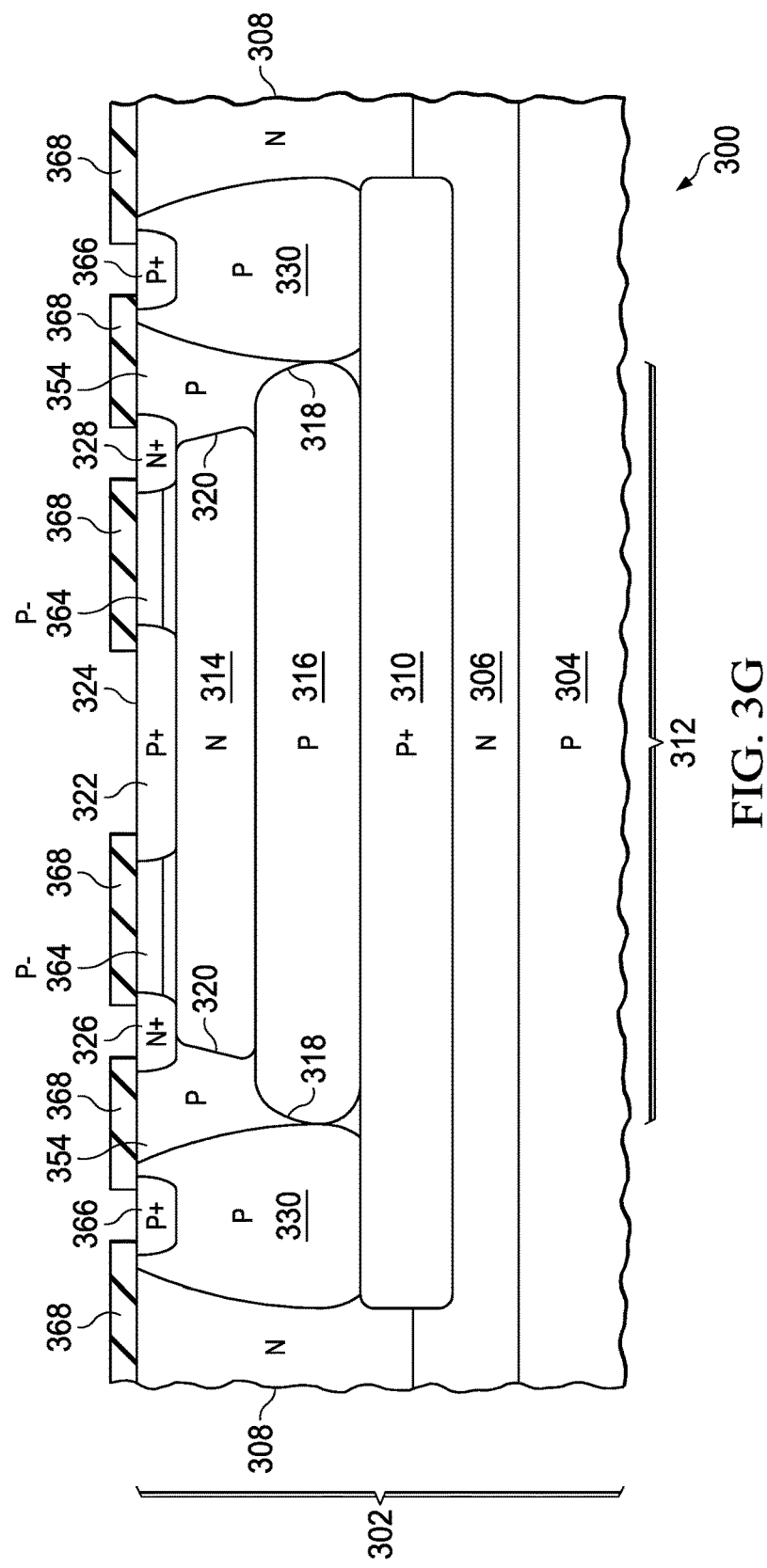

Referring to FIG. 3G, a p-type top gate 322 of the JFET 312 is formed in the substrate 302 above a central portion of the channel layer 314. The top gate 322 may be formed by implanting p-type dopants such as boron into the substrate at a dose of $1 \times 10^{14}$ cm$^{-2}$ to $1 \times 10^{16}$ cm$^{-2}$. The top gate 322 may be formed concurrently with p-type sources and drains of PMOS transistors or emitters of vertical PNP bipolar junction transistors in the semiconductor device 300. Optional p-type sinker contact regions 366 may be formed in the back gate contact 330 concurrently with the top gate 322.

An n-type source 326 and an n-type drain 328 of the JFET 312 are formed in the substrate 302 at opposite ends of the channel layer 314. The source 326 and drain 328 may be formed implanting n-type dopants such as phosphorus and arsenic into the substrate at a total dose of $1 \times 10^{14}$ cm$^{-2}$ to $1 \times 10^{16}$ cm$^{-2}$. The source 326 and drain 328 may be formed concurrently with n-type sources and drains of NMOS transistors in the semiconductor device 300.

A dielectric layer 368 may be formed over the top surface 324 of the substrate 302 which exposes areas in the top gate 322, the source 326 and the drain 328, and the sinker contact regions 366, for subsequent formation of metal silicide.

Formation of the semiconductor device 300 continues with formation of metal silicide, followed by metal contacts and interconnects.

Figure 4:
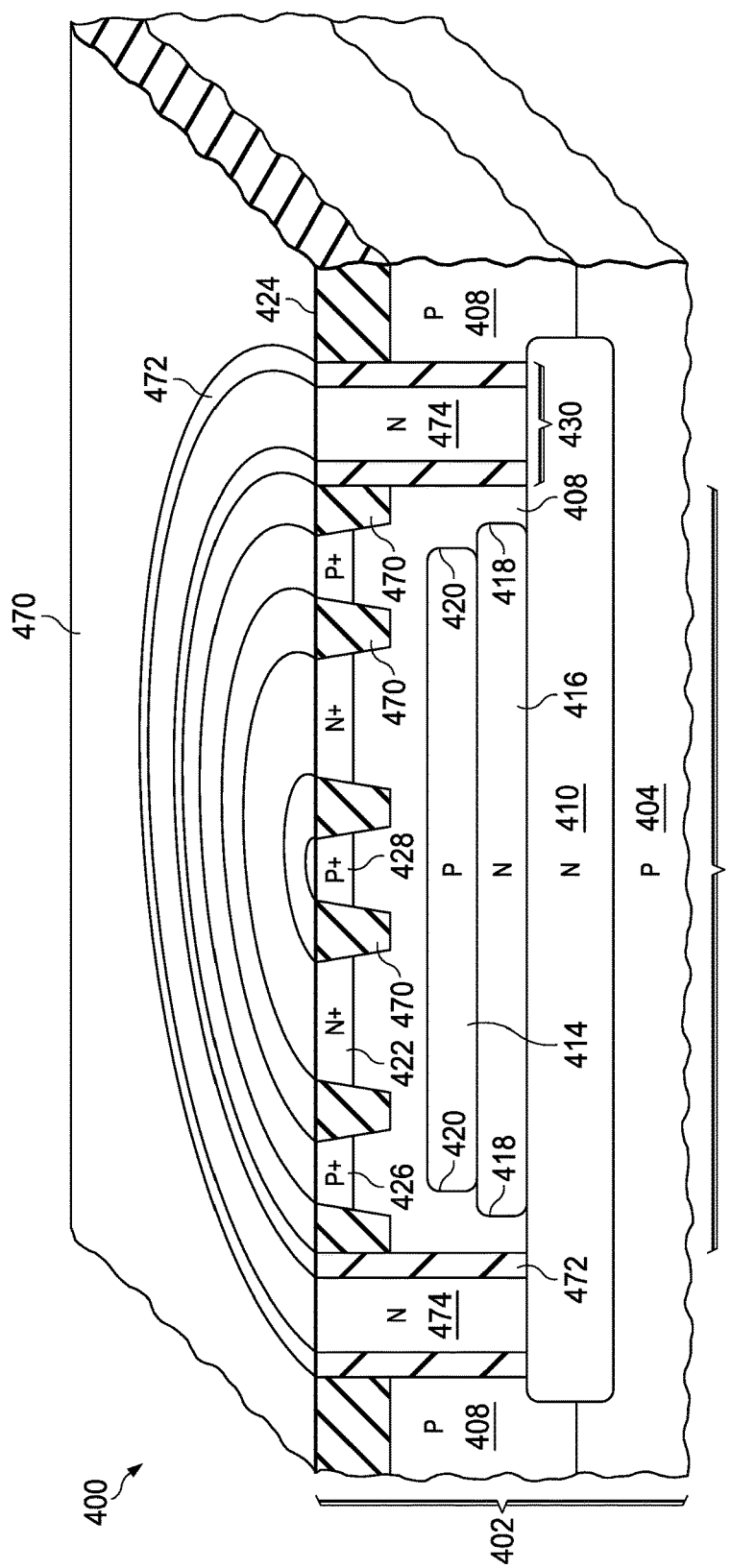
FIG. 4 is a cross section of a further semiconductor device containing an example JFET.

FIG. 4 is a cross section of a further semiconductor device containing an example JFET. The semiconductor device 400 is disposed in and on a substrate 402 containing a p-type base layer 404 comprising a silicon-containing semiconductor material. The substrate 402 includes a p-type epitaxial layer 408 of a silicon-containing semiconductor material disposed on the p-type base layer 404. The p-type epitaxial layer 408 may be, for example, 3 microns to 6 microns thick, and may have an average dopant density of $1 \times 10^{15}$ cm$^{-3}$ to $1 \times 10^{16}$ cm$^{-3}$. An n-type buried layer 410 is disposed at a boundary between the p-type base layer 404 and the p-type epitaxial layer 408, in an area for the JFET 412. The buried layer 410 extends up unto the p-type epitaxial layer 408, and down into the base layer 404. The buried layer 410 may be, for example, 2 microns to 5 microns thick, with an average dopant density of $1 \times 10^{18}$ cm$^{-3}$ to $1 \times 10^{19}$ cm$^3$. The semiconductor device 400 may contain additional similar n-type buried layers in additional components, for example as buried collectors in vertical NPN bipolar junction transistors or as parts of isolation layers for NMOS transistors. A thickness of the p-type epitaxial layer 408 may be selected to provide a desired structure for the additional components.

The JFET 412 includes a p-type channel layer 414 above the buried layer 410 in the p-type epitaxial layer 408. An average dopant density of the channel layer 414 may be, for example, $1 \times 10^{15}$ cm$^{-3}$ to $1 \times 10^{16}$ cm$^{-3}$. In the instant example, the channel layer 414 may be laterally surrounded by the p-type epitaxial layer 408. The JFET 412 further includes an n-type back gate 416 below the channel layer 414. The back gate 416 is disposed above, and in contact with, the buried layer 410. A lateral boundary 418 of the back gate 416 is laterally aligned with a lateral boundary 420 of the channel layer 414. A top surface of the back gate 416 may contact a bottom surface of the channel layer 414, as depicted in FIG. 4. Alternatively, a thin layer of the p-type epitaxial layer 408 may be disposed between the channel layer 414 and the back gate 416. Having the back gate 416 separate from the buried layer 410 may advantageously provide effective back gate control for the JFET, accruing the advantages discussed in reference to FIG. 1. A dopant density of the back gate 416 may be selected to provide a desired balance between depletion of the back gate 416 and capacitance of a pn junction between the back gate 416 and the channel layer 414. A sheet resistance of the buried layer 410 may be adjusted low to advantageously provide uniform voltage for the back gate 416.

In the instant example, the JFET 412 may have a closed-loop configuration, as depicted in FIG. 4. A p-type drain 428 is disposed in the substrate 402 above a central portion of the channel layer 414. A p-type source 426 is disposed in the substrate 402 over the lateral boundary 420 of the channel layer 414. An n-type top gate 422 is disposed in the substrate 402 over the channel layer 414, laterally surrounding the drain 428, and laterally surrounded by the source 426. In the instant example, the drain 428, the top gate 422 and the source 426 may be laterally isolated by field oxide 470 having a shallow trench isolation (STI) configuration, as depicted in FIG. 4.

A back gate contact 430 is disposed in the substrate 402, contacting the buried layer 410 and extending to a top surface 424 of the substrate 402. In the instant example, the back gate contact 430 may include a deep trench with dielectric liner 472 and center conductor 474 of n-type polycrystalline silicon. Metal silicide may be subsequently formed on the drain 428, the top gate 422 and the source 426. The field oxide 470 advantageously blocks formation of the metal silicide between the drain 428, the top gate 422 and the source 426.

Figure 5A:
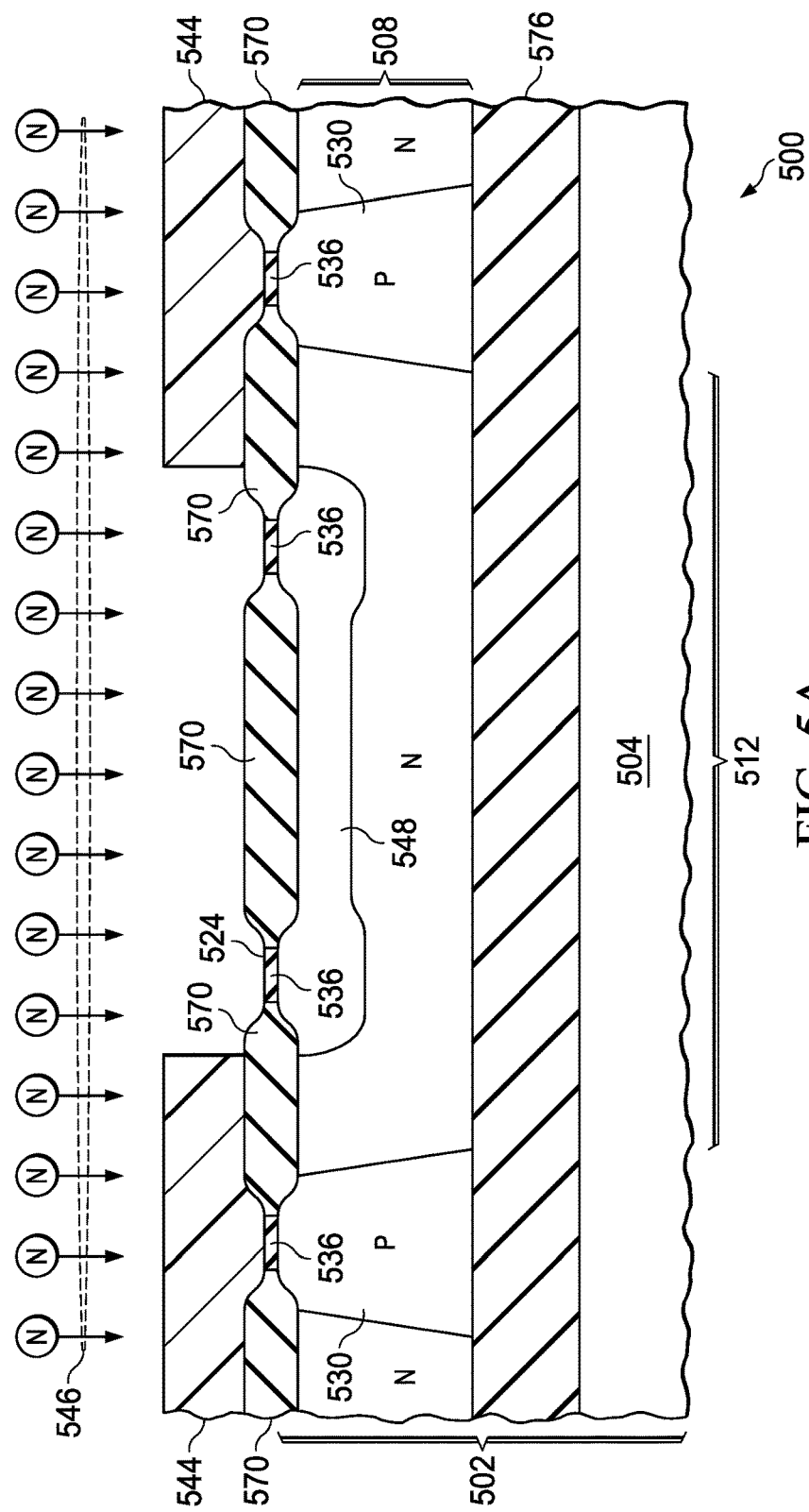
FIG. 5A through FIG. 5C are sections of another example semiconductor device containing a JFET, depicted in stages of a method of formation.
Figure 5B:
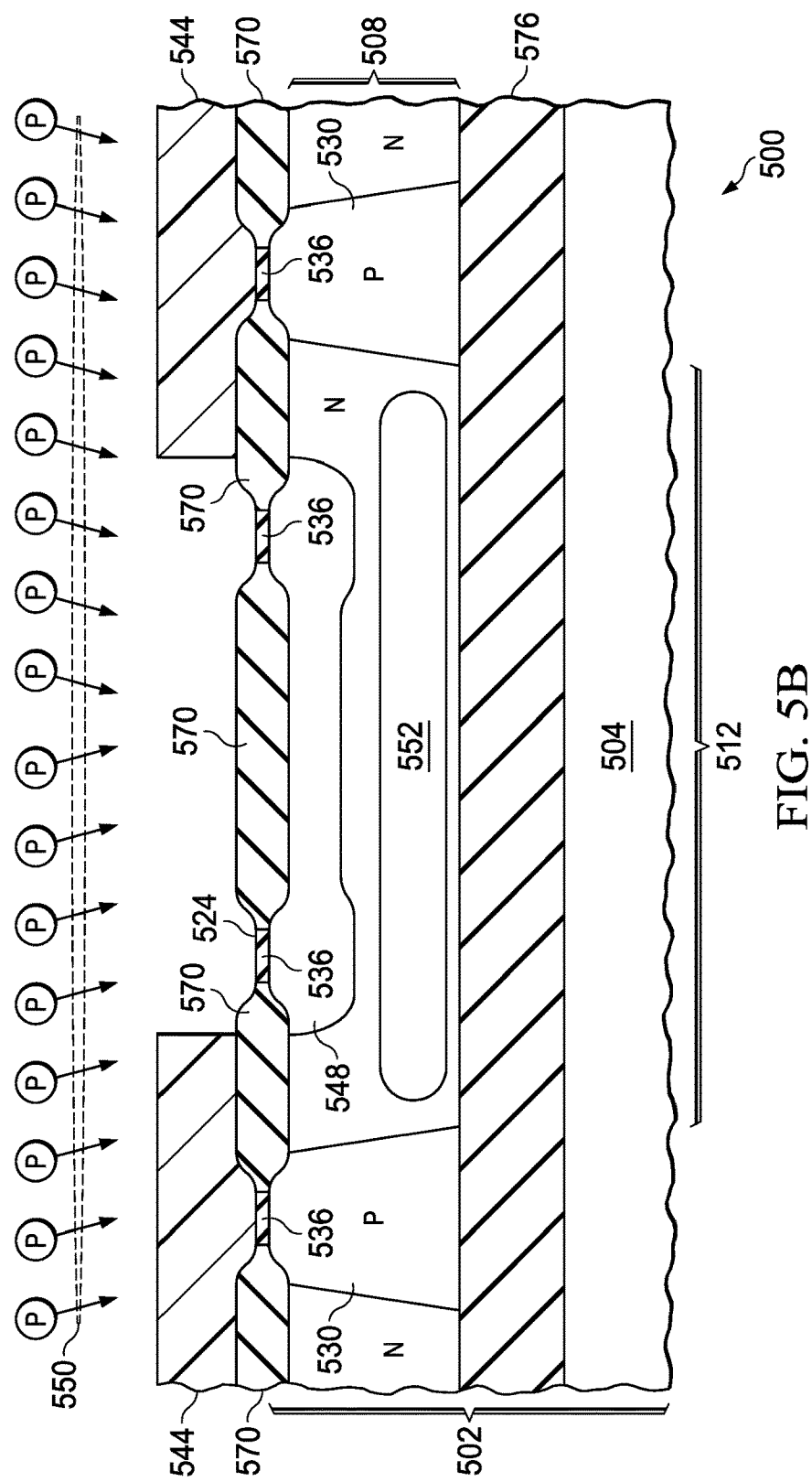
Figure 5C:
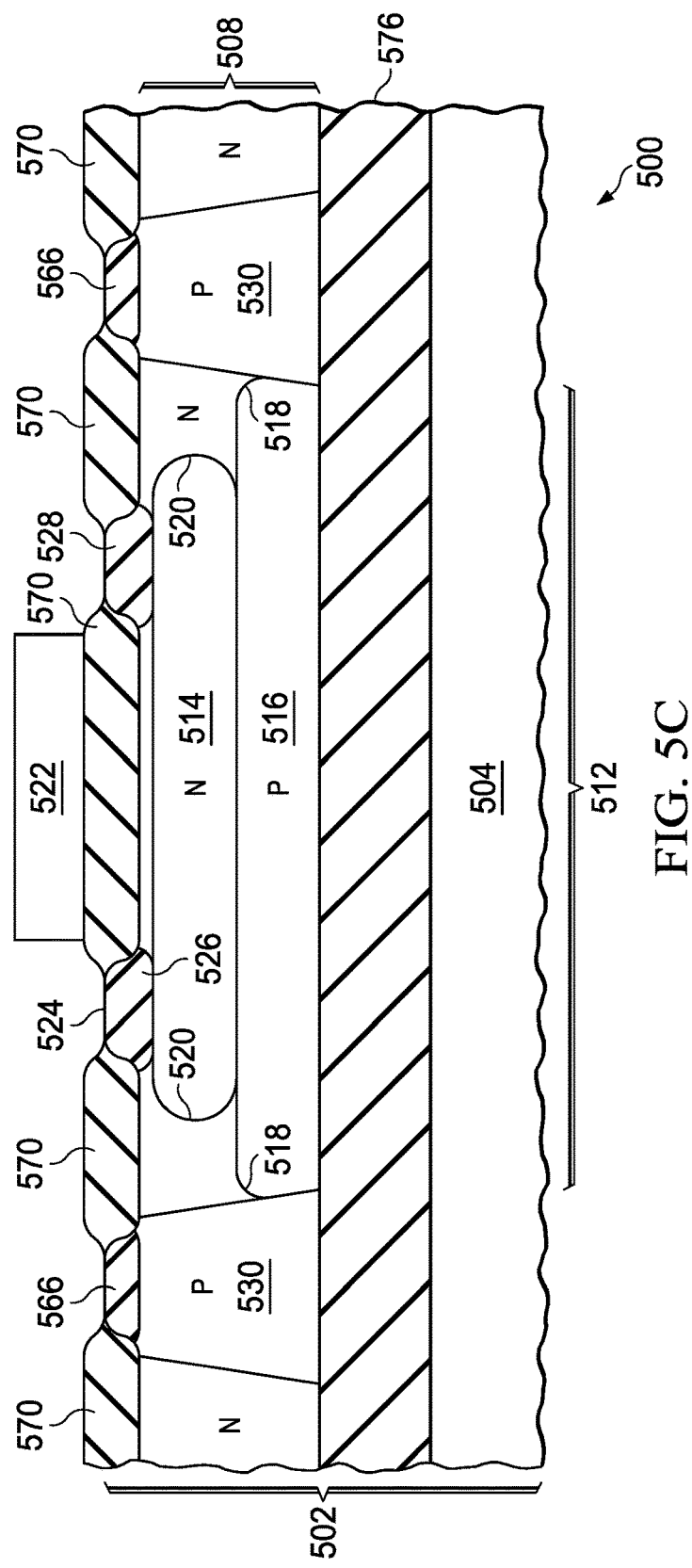

FIG. 5A through FIG. 5C are sections of another example semiconductor device containing a JFET, depicted in stages of a method of formation. Referring to FIG. 5A, the semiconductor device 500 is formed in and on a silicon-on-insulator (SOI) substrate 502. The SOI substrate 502 includes a base layer 504 of single crystal silicon, and a buried oxide layer 576 over the base layer 504. The buried oxide layer 576 may include primarily silicon dioxide and may be 0.2 microns to 2 microns thick. The SOI substrate 502 further includes a device layer 508 of silicon, 2 microns to 6 microns thick, disposed over the buried oxide layer 576. The device layer 508 is n-type in an area for the JFET 512. A p-type back gate contact 530 is formed in the device layer 508 adjacent to the area for the JFET 512, extending from a top surface 524 of the substrate 502 to the buried oxide layer 576. Field oxide 570 may be formed at the top surface 524 of the substrate 502, to laterally separate components of the semiconductor device 500. The field oxide 570 may be formed by a localized oxidation of silicon (LOCOS) process. A layer of pad oxide 536 may be formed at the top surface 524 of the substrate 502 between the elements of the field oxide 570.

A channel mask 544 is formed over the top surface 524 of the substrate 502. The channel mask 544 exposes an area for a channel layer of the JFET 512. The area exposed by the channel mask 544 may optionally be recessed from the back gate contact 530, so that the subsequently formed channel layer is separated from the back gate contact 530. The channel mask 544 may include photoresist, or may include hard mask materials. N-type dopants 546 such as phosphorus are implanted into the substrate 502 in the area exposed by the channel mask 544 to form a channel implanted region 548. The n-type dopants 546 may optionally be implanted in two or more doses at two or more respective energies to obtain a desired distribution of the implanted n-type dopants 546 in the channel implanted region 548.

Referring to FIG. 5B, p-type dopants 550 such as boron are implanted into the substrate 502 in the area exposed by the channel mask 544 to form a back gate implanted region 552 below the channel implanted region 548 and above the buried oxide layer 576. The p-type dopants 550 may be implanted in four steps, at tilt angles greater than 15 degrees, and rotation angles 90 degrees apart. The purpose of the high tilt angles is to form a back gate of the JFET 512 that is electrically connected to the back gate contact 530. The p-type dopants 550 may be implanted in two or more doses at two or more respective energies, to provide a desired distribution of the implanted p-type dopants 550. The channel mask 544 is subsequently removed. In an alternate version of the instant example, the back gate implanted region 552 may be formed before the channel implanted region 548.

Referring to FIG. 5C, a thermal anneal operation is performed on the substrate 502 which activates and diffuses the implanted n-type dopants in the channel implanted region 548 of FIG. 5B to form an n-type channel layer 514. The thermal anneal operation also activates and diffuses the implanted p-type dopants in the back gate implanted region 552 of FIG. 5B to form a p-type back gate 516. A lateral boundary 518 of the back gate 516 contacts the back gate contact 530. The lateral boundary 518 of the back gate 516 is laterally aligned with a lateral boundary 520 of the channel layer 514. In the instant example, the channel layer 514 may be laterally surrounded by semiconductor material of the device layer 508. Forming the JFET 512 as described in the instant example enables making electrical connection to the back gate 516 at the top surface 524 of the SOI substrate 502, while maintaining the advantages of an implanted back gate described in the examples herein.

A hybrid top gate 522 of the JFET 512 is formed over the field oxide 570 above a central portion of the channel layer 514. The top gate 522 may be formed by patterning a layer of polycrystalline silicon formed on the field oxide 570. The top gate 522 may be formed concurrently with gate of PMOS transistors and NMOS transistors in the semiconductor device 500.

An n-type source 526 and an n-type drain 528 of the JFET 512 are formed in the substrate 502 at opposite ends of the channel layer 514. The source 526 and drain 528 may be formed implanting n-type dopants such as phosphorus and arsenic into the substrate. Optional p-type sinker contact regions 566 may be formed in the back gate contact 530.

Metal silicide may be subsequently formed on the drain 528, the top gate 522, the source 526 and the sinker contact regions 566. The field oxide 570 advantageously blocks formation of the metal silicide between the drain 528, the source 526 and the sinker contact regions 566. Formation of the semiconductor device 500 continues with formation of metal contacts and interconnects.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
    a substrate comprising a semiconductor material, the substrate having a top surface; and
    a junction field effect transistor (JFET), comprising:
        a channel layer having a first conductivity type disposed in the substrate; and
        a back gate having a second, opposite, conductivity type disposed in the substrate below the channel layer, opposite from the top surface, wherein the back gate is laterally aligned with the channel layer.

2. The semiconductor device of claim 1, the JFET further comprising a buried layer having the second conductivity type disposed in the substrate under the back gate and contacting the back gate, wherein the buried layer extends laterally past the back gate.

3. The semiconductor device of claim 1, wherein the first conductivity type is n-type and the second conductivity type is p-type.

4. The semiconductor device of claim 1, further comprising a back gate contact disposed in the substrate, extending to the top surface, the back gate contact being electrically coupled to the back gate, wherein the channel layer does not extend to the back gate contact.

5. The semiconductor device of claim 4, wherein semiconductor material of the substrate having the first conductivity type is disposed between the channel layer and the back gate contact.

6. The semiconductor device of claim 1, the JFET further comprising a skin inversion layer having the second conductivity type disposed in the substrate above the channel layer, the skin inversion layer being laterally aligned with the channel layer.

7. The semiconductor device of claim 1, wherein the back gate extends laterally past the channel layer by equal distances on a source side and a drain side of the channel layer.

8. The semiconductor device of claim 1, wherein the JFET further comprises a top gate having the second conductivity type disposed in the substrate above the channel layer and extending to the top surface of the substrate.

9. The semiconductor device of claim 1, wherein the JFET further comprises:
    a source having the first conductivity type disposed in the substrate, extending from the top surface of the substrate to the channel layer; and
    a drain having the first conductivity type disposed in the substrate, extending from the top surface of the substrate to the channel layer.

10. The semiconductor device of claim 1, wherein the first conductivity type is p-type and the second conductivity type is n-type.

11. A device, comprising:
    a first buried layer disposed within a semiconductor substrate such that a portion of said substrate is located between said first buried layer and a top surface of said substrate and laterally bounds said first buried layer; and
    a second buried layer disposed within the substrate such that a portion of said substrate is located between said first buried layer and said second buried layer, and said second buried layer is laterally aligned with said first buried layer.

12. The device of claim 11, wherein said first buried layer has a first conductivity type and said second buried layer has a second different conductivity type.

13. The device of claim 12, wherein said first buried layer is n-type, and said second buried layer is p-type.

14. The device of claim 13, wherein first buried layer is located between said second buried layer and said substrate.

15. The device of claim 11, further comprising a third buried layer in contact with said second buried layer and disposed such that said second buried layer is located between third buried layer and said surface.

16. The device of claim 15, wherein said third buried layer extends past lateral boundaries of said second buried layer.

17. The device of claim 15, wherein said third buried layer is connected to a vertical sinker that is connected to a conductive layer at said top surface.

18. The device of claim 11, further comprising a gate stripe within said substrate, said gate stripe being narrower than said first buried layer and about centered laterally with respect to said first buried layer.

19. The device of claim 18, further comprising a source stripe and a drain stripe disposed within said substrate such that said gate stripe is located between said source and drain stripes.

20. The device of claim 19, wherein an edge of said source stripe is about aligned with a lateral boundary of said first buried layer, and an edge of said drain stripe is about aligned with an opposite lateral boundary of said first buried layer.

* * * * *